United States Patent
McLaren

(10) Patent No.: US 9,667,199 B1
(45) Date of Patent: May 30, 2017

(54) DOHERTY AMPLIFIERS WITH MINIMUM PHASE OUTPUT NETWORKS

(71) Applicant: Freescale Semiconductor, Inc., Austin, TX (US)

(72) Inventor: Roy McLaren, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/178,545

(22) Filed: Jun. 9, 2016

(51) Int. Cl.
*H03F 3/195* (2006.01)
*H03F 1/02* (2006.01)

(52) U.S. Cl.
CPC ............ *H03F 1/0288* (2013.01); *H03F 3/195* (2013.01); *H03F 2200/387* (2013.01); *H03F 2200/408* (2013.01); *H03F 2200/451* (2013.01); *H03F 2200/541* (2013.01)

(58) Field of Classification Search
CPC ............................... H03F 1/0288; H03F 3/195
USPC ...................... 330/124 R, 295, 53
See application file for complete search history.

(56) References Cited

U.S. PATENT DOCUMENTS

| | | | |
|---|---|---|---|
| 6,262,629 B1 * | 7/2001 | Stengel ................. | H03F 1/0261 330/124 R |
| 6,791,417 B2 | 9/2004 | Pengelly et al. | |
| 7,521,995 B1 | 4/2009 | Krvavac | |
| 8,022,760 B2 | 9/2011 | Gajadharsing et al. | |
| 8,593,219 B1 * | 11/2013 | Root ..................... | H03F 1/0288 330/124 R |
| 8,653,889 B1 | 2/2014 | Acimovic et al. | |
| 8,717,099 B2 | 5/2014 | Wilson et al. | |
| 9,007,142 B1 * | 4/2015 | Ozard ................... | H03F 1/0288 330/124 R |
| 2013/0241639 A1 | 9/2013 | Wilson et al. | |
| 2014/0320214 A1 * | 10/2014 | Liu ........................ | H03F 1/0288 330/295 |
| 2015/0145601 A1 | 5/2015 | Moronval et al. | |
| 2015/0180428 A1 * | 6/2015 | Pham ..................... | H03F 3/211 330/295 |
| 2016/0336903 A1 * | 11/2016 | Ahmed ................... | H03F 1/0288 |

FOREIGN PATENT DOCUMENTS

WO    2009/081341 A1    7/2009

* cited by examiner

*Primary Examiner* — Patricia T Nguyen
(74) *Attorney, Agent, or Firm* — Sherry W. Schumm

(57) ABSTRACT

A Doherty amplifier includes an output combining network that has a first combining network input coupled to a main amplifier path, a lowest-order combining network input coupled to a lowest-order peaking amplifier path, and N−2 additional combining network inputs coupled to other peaking amplifier paths. A final summing node is coupled to the combining network output, and is directly coupled to the first combining network input. N−2 intermediate summing nodes are coupled to the N−2 additional combining network inputs. An offset line is coupled between the lowest-order combining network input and a lowest-order summing node. A longest phase delay imparted by the output combining network on a peaking RF signal between the lowest-order combining network input and the final summing node is greater than all other phase delays imparted on any other RF signal provided to the first combining network input and the N−2 additional combining network inputs.

21 Claims, 4 Drawing Sheets

US 9,667,199 B1

DOHERTY AMPLIFIERS WITH MINIMUM PHASE OUTPUT NETWORKS

TECHNICAL FIELD

Embodiments of the subject matter described herein relate generally to Doherty amplifiers.

BACKGROUND

In telecommunications systems that are designed to handle signals with high peak-to-average power ratios (PAPR), Doherty power amplifier architectures have become popular due to their relatively high linearity and efficiency at back-off levels, when compared with other types of amplifier topologies. A conventional two-way Doherty power amplifier includes a class-AB biased main (or "carrier") amplifier and a class-C biased peaking amplifier in a parallel arrangement. When an input signal has relatively low to moderate power, the main amplifier operates to amplify the input signal, and the peaking amplifier is minimally conducting (e.g., the peaking amplifier essentially is in an off state). During this phase of operation, an impedance transformer in the output combiner network determines the maximum VSWR (voltage standing wave ratio) to which the main amplifier will be exposed. Conversely, as the input signal power increases to a level at which the main amplifier reaches voltage saturation, the input signal is split (e.g., using a 3- or other decibel (dB) power splitter) between the main and peaking amplifier paths, and both amplifiers operate to amplify their respective portion of the input signal. Ultimately, the amplified signals are combined to produce the final amplified output signal.

As the Doherty amplifier input signal level increases beyond the point at which the main amplifier is operating in compression, the peaking amplifier conduction also increases, thus supplying more current to the load. In response, the load line impedance of the main amplifier output decreases. In fact, an impedance modulation effect occurs in which the load line of the main amplifier changes dynamically in response to the input signal power (i.e., the peaking amplifier provides active load pulling to the main amplifier). An impedance inverter at the output of the main amplifier transforms the main amplifier load line impedance to a high value at backoff, allowing the main amplifier to efficiently supply power to the load over an extended output power range.

In some Doherty amplifier topologies, an additional peaking amplifier may be coupled in parallel with the main amplifier and the first peaking amplifier. For example, a 3-way Doherty amplifier, includes a main amplifier and two peaking amplifiers coupled in parallel. In such a topology, the peaking amplifiers are turned on sequentially as power levels increase.

In the practical realization of a conventional Doherty power amplifier, each impedance inverter is supplemented with an offset line to ensure correct phase relationships for optimal load modulation. Each offset line occupies significant printed circuit board (PCB) area, which is contrary to miniaturization efforts. As can be imagined, in 3-way Doherty amplifier, the issue of PCB area occupied by multiple impedance inverters and offset lines is even more pronounced than for a two-way Doherty amplifier. Further, these offset lines, together with the impedance inverters, may restrict the RF bandwidth performance of the Doherty amplifier. Further still, depending on implementation, some transmission line elements may have relatively high characteristic impedances, and this may undesirably limit the power handling capability of an amplifier.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of the inventive subject matter include N-way, inverted Doherty amplifiers, N≥3, with a minimum phase output network arrangement, resulting in a minimized output combiner topology. The various embodiments may retain the benefits inherent in an N-way Doherty amplifier, while potentially providing simpler Doherty amplifier designs, reduction of PCB area occupation, enhanced RF bandwidth capability, improved immunity to production variation, and/or improved power handling capability.

In various embodiments, an N-way, N≥3, Doherty amplifier includes a power splitter and phase shifter array, which feeds N amplification paths. Each amplification path includes a power transistor device. More specifically, the N power devices include a main amplifier and N−1 peaking amplifiers. As will be described in more detail below, the N-way array of power devices drives a minimum phase output network with at least N-2 90 degree impedance transformers and one offset line. When incorporated into a larger electrical system, the minimum phase output network may feed an RF load of impedance $R_{load}$. Throughout this description, an RF load impedance, $R_{load}$, of 50 Ohms is assumed. Furthermore $R_0$, referred to herein as the system impedance, is the load impedance to which the N amplifier stages are matched. Based on the description herein, those of skill in the art would understand how to adjust the various impedances in a system with a different RF load impedance and/or system impedance, $R_0$.

According to the various embodiments, a minimum phase output network is achieved, in part, by excluding customary 90 degree impedance inverters and offset lines typically used in N−1 of the output network branches of a conventional N-way Doherty amplifier. This may provide for a significantly more compact output network, enhanced RF bandwidth capability, and higher power handling capability, when compared with conventional Doherty amplifiers. In the various embodiments, the power devices (e.g., devices 243-247, 343-346, FIGS. 2, 3) can be designed to allow optimal operation with minimum output network phase.

Figure 1:
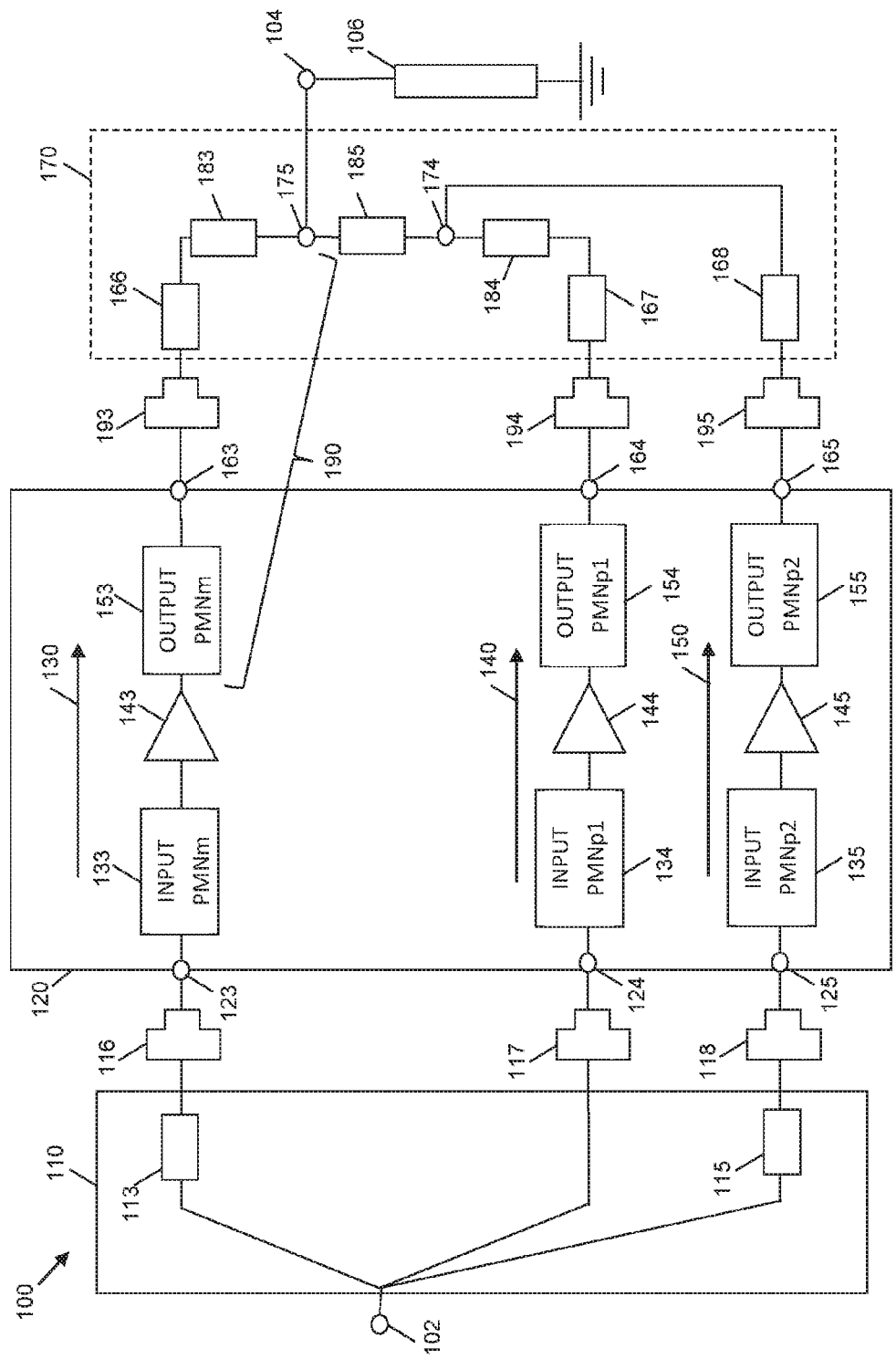
FIG. 1 is a simplified schematic diagram of a conventional 3-way Doherty amplifier.

FIG. 1 is a simplified schematic diagram of a conventional, non-inverted 3-way Doherty amplifier 100. Amplifier 100 includes an input node 102, an output node 104, a power divider 110, three PCB-level input matching networks 116-118, an RF amplifier device 120, three PCB-level output matching networks 193-195, and a combining network 170. Three amplification paths are provided through the RF amplifier device 120, including a main amplifier path 130 and two peaking amplifier paths 140, 150, where each amplification path includes an amplifier stage 143-145 (e.g., a single stage or multiple-stage power transistor device) for amplifying an RF signal conducted through the path.

During operation of Doherty amplifier 100, amplifier stage 143 is biased to operate in class AB mode, and amplifier stages 144, 145 are biased to operate in different class C modes. More specifically the transistor arrangement of main amplifier stage 143 is biased to provide a conduction angle between 180 and 360 degrees. Conversely, the transistor arrangements of the peaking amplifier stages 144, 145 are biased to provide conduction angles less than 180 degrees.

At low power levels, where the power of the input signal at node 102 is lower than the turn-on threshold levels (or "break points") of both peaking amplifier stages 144, 145, the amplifier 100 operates in a low-power (or second back-off) mode in which the main amplifier stage 143 is the only amplifier supplying current to a load 106 coupled to an output 104 of the amplifier 100. When the power of the input signal exceeds a threshold level of the first peaking amplifier stage 144 (but not a threshold level of the second peaking amplifier stage 145), the amplifier 100 operates in a first back-off mode in which the main amplifier stage 143 and the first peaking amplifier stage 144 both supply current to the load 106. At this point, the first peaking amplifier stage 144 provides active load modulation at a final summing node 175, allowing the current of the main amplifier stage 143 to continue to increase linearly. Finally, when the power of the input signal exceeds the threshold levels of both the first and second peaking amplifier stages 144, 145, the amplifier 100 operates in a high-power mode in which the main amplifier stage 143 and both peaking amplifier stages 144, 145 supply current to the load 106. At this point, the second peaking amplifier stage 145 provides active load modulation at summing node 174, allowing the current of the first peaking amplifier stage 144 to continue to increase linearly, and both the first and second peaking amplifier stages 144, 145 provide active load modulation at the final summing node 175, allowing the current of the main amplifier stage 143 to continue to increase linearly.

Power divider 110 is coupled between input node 102 and the RF amplifier device 120. Power divider 110 is configured to divide the input power of an input signal received at node 102 into multiple portions of the input signal, where respective portions of the input signal are provided to input terminals 123-125 of the RF amplifier device 120. For example, a first output of the power divider 110 may be coupled to the input terminal 123 corresponding to the main path 130, a second output of the power divider 110 may be coupled to the input terminal 124 corresponding to the first peaking path 140, and a third output of the power divider 110 may be coupled to the input terminal 125 corresponding to the second peaking path 150. During operation in the high-power mode when the main and both peaking amplifiers are supplying current to the load 106, the power divider 110 divides the input signal power between the amplifier paths 130, 140, 150. For example, the power divider 110 may divide the power equally, such that roughly one third of the input signal power is provided to each path 130, 140, 150. Alternatively, the power divider 110 may divide the power unequally.

The power divider 110 may include delay line elements 113, 115 (e.g., transmission line segments), which impart various phase delays to the divided portions of the input RF signal. For example, a first delay line element 113 along the main path 130, and a second delay line element 115 along the second peaking path 150 each may impart a 90 degree phase shift to the RF signals that are to be provided to the main and second peaking amplifier paths 130, 150, respectively. As will be better understood later in the description, the phase delays imparted by the delay line elements 113, 115 ensure that the amplified signals arriving at summing nodes 174, 175 arrive in phase with each other, given other delays imparted by elements of the output matching networks and the combining network 170.

The signals produced by the power divider 110 are conveyed through the PCB-level input matching networks 116-118 to the RF amplifier device 120. Essentially, each PCB-level input matching network 116-118 is configured to raise the impedance along each path 130, 140, 150 at input terminals 123-125 of the RF amplifier device 120 to a desired level at the input to the PCB level input matching networks 116-118 at the fundamental frequency (or carrier frequency), $F_0$, of the amplifier 100.

Within RF amplifier device 120, the main and peaking-paths 130, 140, 150 each include an input pre-match network (INPUT PMN) 133-135, an amplifier stage 143-145, and an output pre-match network (OUTPUT PMN) 153-155 coupled in series between input terminals 123-125 and output terminals 163-165. In FIG. 1, "m" designates the main path 130, "p1" designates the first peaking path 140, and "p2" designates the second peaking path 150. Each of the input pre-match networks 133-135 is configured to provide a desired input impedance at its respective input terminal 123-125 at $F_0$. Similarly, each of the output pre-match networks 153-155 is configured to provide an increased output impedance at its respective output terminal 163-165 at $F_0$. In addition, the amplifier 100 includes a PCB-level output matching network 193-195 coupled between each output terminal 163-165 and an input to combining network 170. Essentially, each PCB-level output matching network 193-195 is configured to raise the impedance along each path 130, 140, 150 even further.

Combining network 170 is coupled between the outputs of the PCB-level output matching networks 193-195 and output node 104. Combining network 170 includes three inputs, two summing nodes 174, 175, three offset lines 166-168, two impedance inverters 183-184, an impedance transformer 185, and an output that is coupled to the amplifier output 104. The output terminals 163-165 of the device 120 each are coupled to an input to the combining network 170 through one of the PCB-level output matching networks 193-195. As used herein, the term "impedance inverter" means a 90 degree transformer section connected in series in the output section of an amplification path (e.g., elements 183, 184, FIG. 1), whereas the term "impedance transformer" means a 90 degree transformer section connected between adjacent summing nodes in an output combiner network (e.g., element 185, FIG. 1). The term "output transformer" refers to a 90 degree or greater transformer section(s) connected to the output node of the combiner network and the RF load (e.g., element 283, FIG. 2).

Each series-coupled pre-match network 153-155, PCB-level output matching network 193-195, offset line 166-168, impedance inverter 183-184, and impedance transformer 185 combination is designed to ensure correct phase relationships for optimal load modulation. More specifically, to ensure the correct phase to load modulate the main amplifier stage 143, the total phase delay imparted along the path between the output of amplifier stage 143 and the final summing node 175 (indicated by bracket 190) should be an odd multiple of 90 degrees (i.e., m×90 degrees, where m=1, 3, 5, . . . ) for proper Doherty operation. Similarly, to ensure the correct phase to load modulate amplifier stage 144, the total phase delay imparted along the path between the output of amplifier stage 144 and summing node 174 should be an odd multiple of 90 degrees (i.e., m×90 degrees, where m=1, 3, 5, . . . ). In addition, the total phase delay along the path between the output of amplifier stage 144 and the final summing node 175 should be an even multiple of 90 degrees (i.e., m×90 degrees, where m=0, 2, 4, . . . ) to prevent amplifier 144 loading summing node 175 in the low-power (or second back-off) mode. Similarly, the total phase delay along the path between the output of amplifier stage 145 and summing node 174 should be an even multiple of 90 degrees (i.e., m×90 degrees, where m=0, 2, 4, . . . ) to prevent amplifier 145 loading summing node 174 in the second back-off and first back-off modes.

With higher power, higher frequency transistor devices it can be more difficult to design an output matching network for a reasonably large load impedance (e.g., 50 Ohms) (e.g., consisting of pre-match network 153 in series with PCB-level output matching network 193) that imparts less than or equal to 90 degrees of phase delay to the RF signal. As used herein, the term "nearest local summing node" for any particular amplifier path means the summing node that is electrically closest to the output of the amplifier stage of that amplifier path. A similar design constraint is present for peaking path 140. Therefore, practical implementations with m=1 (for paths 130 and 140) can be more difficult to realize in systems that include high power, high frequency transistor devices. Furthermore, m=0 for path 145 is typically not realizable in systems that include high power, high frequency transistor devices.

Accordingly, along the main amplification path 130, for example, a practical implementation of a typical, conventional amplifier design defaults to providing 270 degrees (i.e., m=3) of phase delay between the output of the amplifier stage 143 and the final summing node 175, where the 270 degree phase delay is the sum of delays imparted by the pre-match network 153, the PCB-level output matching network 193, the offset line 166, and the 90 degree impedance inverter 183. Because the 90 degree impedance inverter 183 imparts a 90 degree delay on the signal, the offset line 166 is designed to impart a "residual" delay to ensure that the sum of delays (imparted by the pre-match network 153, the PCB-level output matching network 193, the offset line 166, and the 90 degree impedance inverter 183) is 270 degrees.

As discussed above, the main RF signal produced at the output of amplifier stage 143 is conducted through pre-match network 153, PCB-level output matching network 193, offset line 166, and 90 degree impedance inverter 183 to the final summing node 175. At higher input signal power levels, when the first peaking amplifier stage 144 also is supplying current to the load 106, the first peaking RF signal produced at the output of amplifier stage 144 is conducted through pre-match network 154, PCB-level output matching network 194, offset line 167, and 90 degree impedance inverter 184 to an intermediate summing node 174. At the highest input signal power levels, when the second peaking amplifier stage 145 also is supplying current to the load 106, the second peaking RF signal produced at the output of amplifier stage 145 is conducted through pre-match network 155, PCB-level output matching network 195, and offset line 168 to the intermediate summing node 174.

Along the first peaking path 140, the 90 degree impedance inverter 184 imparts a 90 degree phase delay to the RF signal produced at output terminal 164, and combined with the phase delays imparted by matching networks 154 and 194 and the additional phase delay imparted by offset line 167, the total phase delay between the output of amplifier stage 144 and the intermediate summing node 174 is 270 degrees. Along the second peaking path 150, the combination of the phase delay imparted by output matching networks 155 and 195 and offset line 168 imparts a total phase delay of 180 degrees between the output of amplifier stage 145 and the intermediate summing node 174. These phase delays result in an in-phase arrival of the peaking RF signals from paths 140, 150 at the intermediate summing node 174. The intermediate summing node 174 reactively combines the amplified peaking signals received from the peaking amplifier paths 140, 150.

The combined peaking signal at the intermediate summing node 174 is conveyed through the impedance transformer 185 to the final summing node 175. The impedance transformer 185 imparts a 90 degree phase delay to the combined peaking signal from the intermediate summing node 174. Along the main amplifier path 130, the previously-discussed total phase delay between the main amplifier stage 143 and the final summing node 175 results in an in-phase arrival of the main RF signal and the combined peaking signal at the final summing node 175.

The final summing node 175 reactively combines the amplified main and combined peaking signals, and produces the amplified RF signal at amplifier output 104. As discussed above, power divider 110, RF amplifier device 120, and combining network 170 are designed so that the total phase shifts applied along the amplifier paths 130, 140, 150 ensure that the currents ultimately provided to summing nodes 174, 175 by the respective amplifier paths 140, 150 are received substantially in-phase with each other. Accordingly, the current provided by the final summing node 175 to output node 104 (and to load 106) represents the in-phase summation of the currents provided by amplifier paths 130, 140, 150.

Because the offset lines 166-168 and impedance inverters 183-184 may consume significant PCB real estate, the offset lines 166-168 and impedance inverters 183-184 make a significant contribution to the overall size of the amplifier 100. In addition, in Doherty amplifier 100, the offset lines 166-167, the impedance inverters 183-184 also may significantly restrict the RF bandwidth performance of the amplifier 100. An N-way, N≥3, Doherty amplifier has inherent benefits including, but not limited to, favorable power scaling and linearity properties. However, the issue of PCB area occupied by multiple impedance inverters and offset lines is pronounced in conventional N-way Doherty amplifiers, and the issue is exacerbated for values of N>3.

Figure 2:
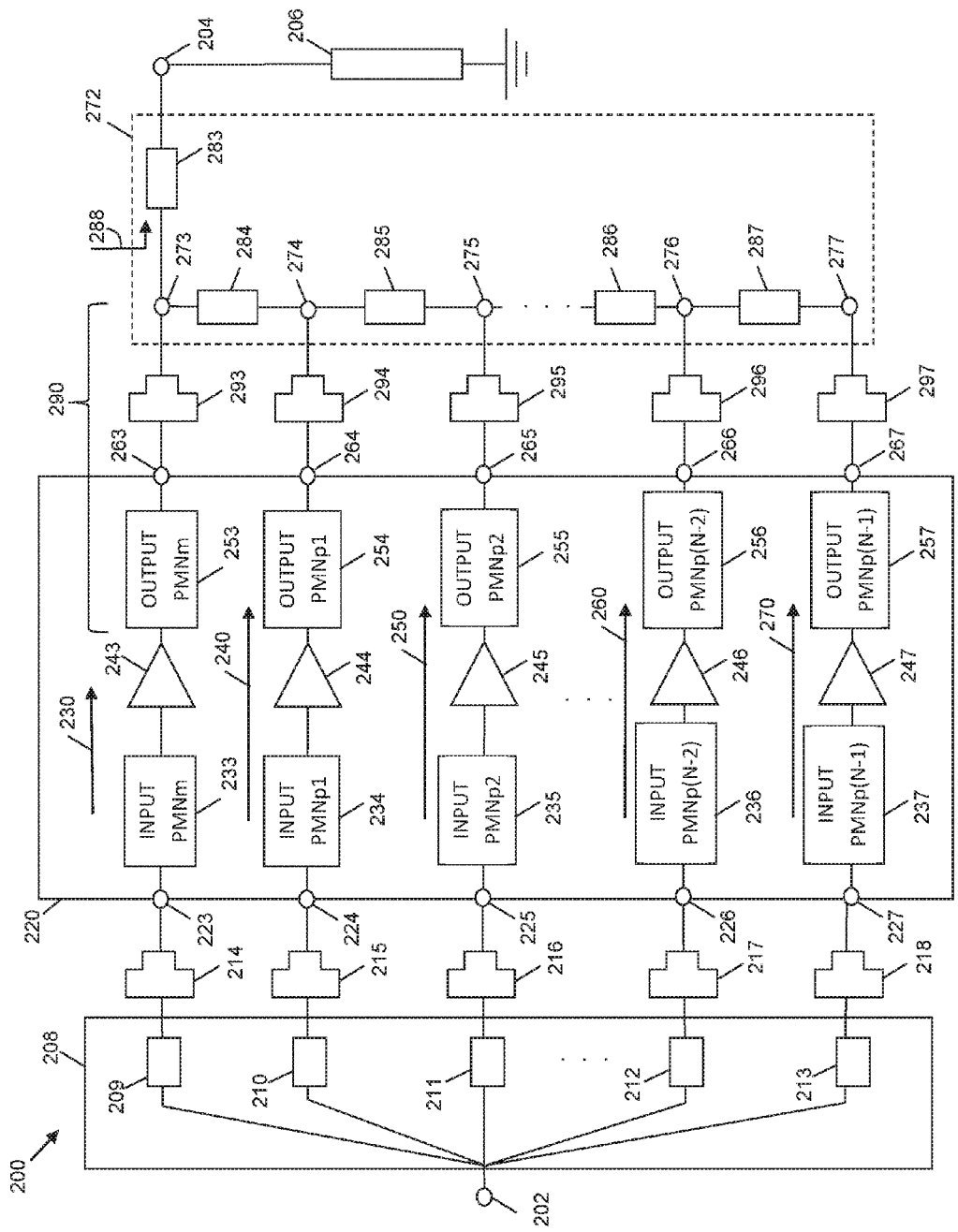
FIG. 2 is a simplified schematic diagram of an N-way Doherty amplifier, N≥3, in accordance with an embodiment.
Figure 3:
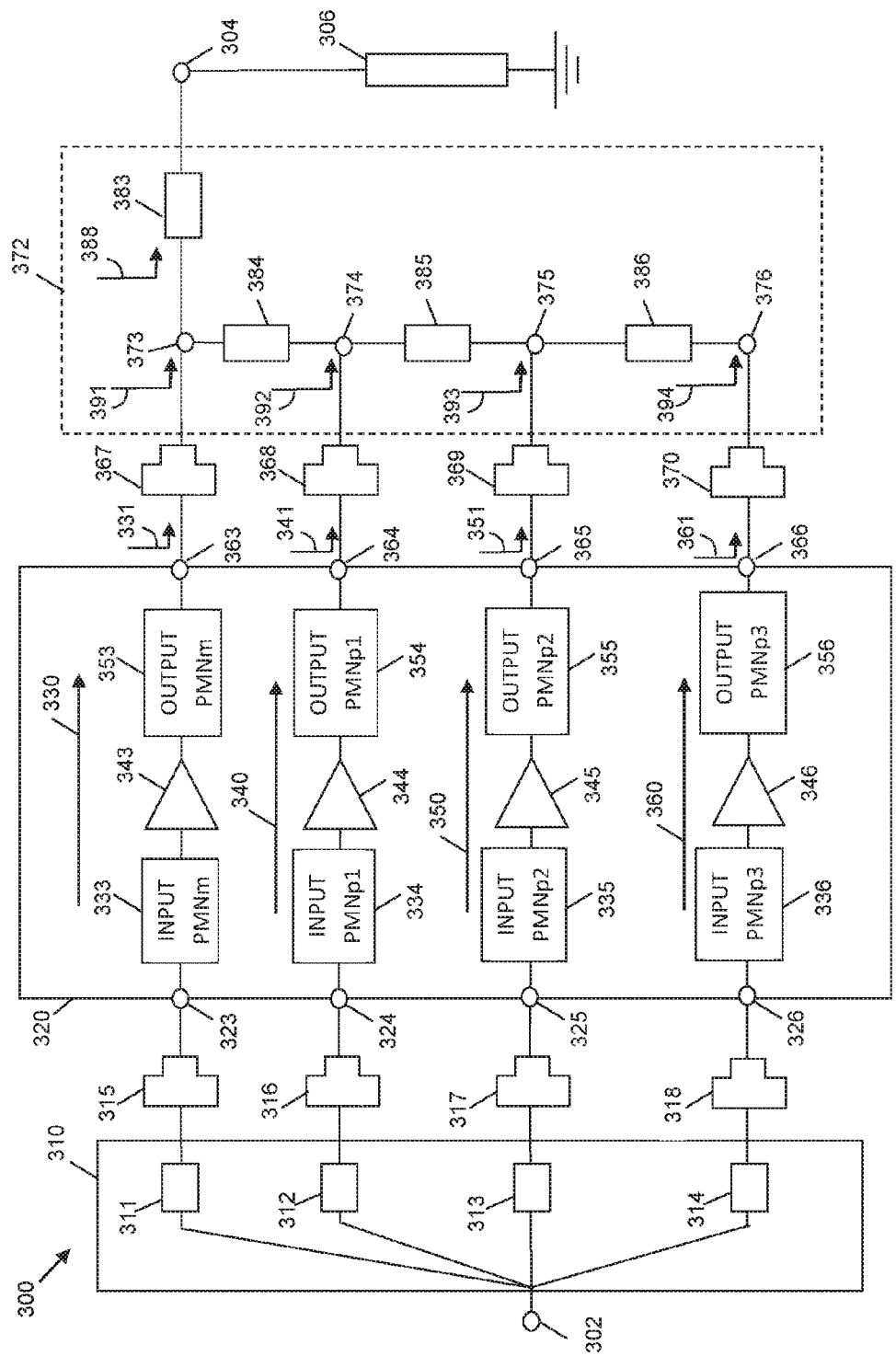
FIG. 3 is a simplified schematic diagram of a 4-way Doherty amplifier, in accordance with an embodiment.
Figure 5:
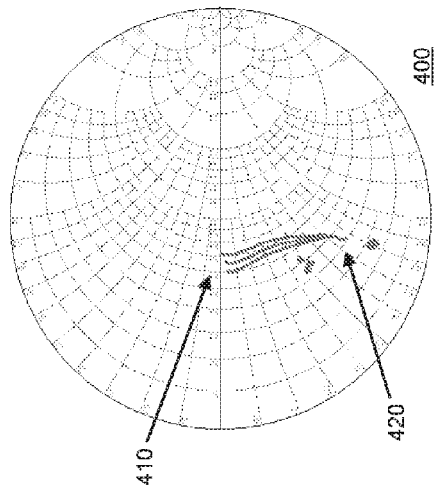
FIGS. 4-7 are Smith charts illustrating load impedance trajectories for the main and peaking amplifiers of the 4-way Doherty amplifier of FIG. 3.
Figure 7:
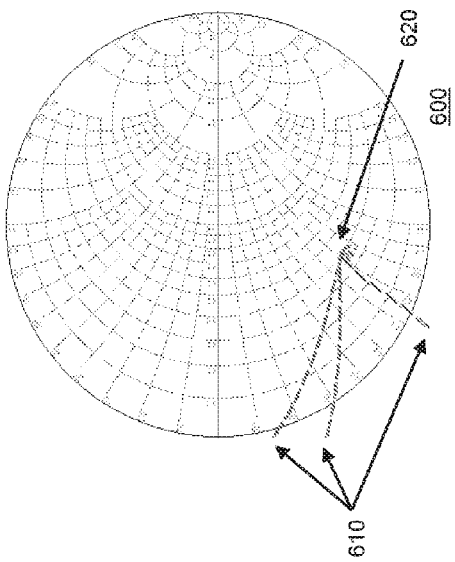
Figure 4:
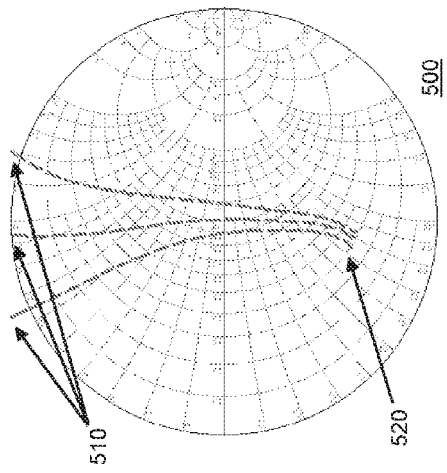
Figure 6:
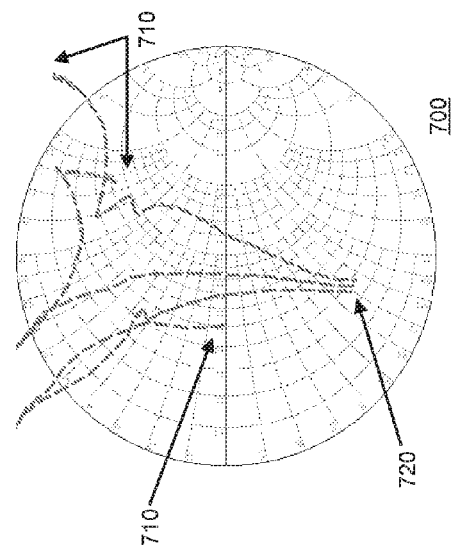

To overcome these issues, embodiments of Doherty amplifiers depicted in FIGS. 2 and 3 and described below include phase minimized arrangements for a general N-way Doherty amplifier (FIG. 2), and more specifically for a 4-way Doherty amplifier (FIG. 3). The various embodiments may retain the benefits inherent to an N-way Doherty amplifier, while also providing a minimized output combiner topology. More specifically, according to the various embodiments, a minimum phase output network is achieved, in part, by excluding the customary 90 degree impedance inverters and offset lines that are included in N−1 of the output network branches of a conventional N-way Doherty amplifier.

FIG. 2 is a simplified schematic diagram of an N-way Doherty amplifier 200, where N may be any integer greater than 2 (e.g., N=3, 4, or any integer between 5 and 10 or more), in accordance with an embodiment. The Doherty amplifier 200 of FIG. 2 has an inverted topology, meaning that amplifier 200 has an inverted load network configuration, when compared with a non-inverted Doherty amplifier (e.g., amplifier 100, FIG. 1). In addition, as will be described in more detail below, the various embodiments of Doherty amplifier 200 include a minimum phase output network, which is achieved, in part, by excluding the typical 90 degree impedance inverters and offset lines in at least N-2 of the output network branches of the amplifier. According to the various embodiments, about 180 degrees of phase delay circuitry is eliminated from each of N-1 of the amplifier paths, when compared with conventional implementations.

More specifically, amplifier 200 is an N-way, inverted Doherty amplifier that includes an input node 202, an N-way power divider and phase shift network 208, an RF amplifier device 220 with a main amplifier path 230 and N-1 peaking amplifier paths 240, 250, 260, 270, N PCB-level input matching networks 214-218, N PCB-level output matching networks 293-297, an output combining network 272, and an output node 204. Although four peaking amplifier paths are depicted in FIG. 2, the number of peaking amplifier paths may be greater or smaller, depending on the selected value of N. Each amplification path includes an amplifier stage 243-247 (e.g., a single stage or multiple-stage power transistor integrated circuit (IC)) for amplifying an RF signal conducted through the path. Although the power transistor ICs may be of equal size (e.g., in a symmetric Doherty configuration), the power transistor ICs may have unequal sizes, as well (e.g., in various asymmetric Doherty configurations).

During operation of Doherty amplifier 200, amplifier stage 243 is biased to operate in class AB mode, and amplifier stages 244-247 are biased to operate in different class C modes. More specifically the transistor arrangement of main amplifier stage 243 is biased to provide a conduction angle between 180 and 360 degrees. Conversely, the transistor arrangements of the peaking amplifier stages 244-247 are biased to provide conduction angles less than 180 degrees. According to various embodiments, the amplifier stages 243-247 may be asymmetrical (i.e., having transistor ICs of different sizes) or symmetrical (i.e., having transistor ICs of substantially the same size).

According to an embodiment, the amplifier stage 244 of the first peaking amplifier path 240 is biased to turn on (i.e., begin providing current to a load 206 that is coupled to the output node 204 of the amplifier 200) at a first input signal power threshold (or "break point"), which corresponds to an input signal power level (at node 202) at or near which the main amplifier stage 243 reaches voltage saturation. The first peaking amplifier path 240 also may be referred to herein as the "highest-order" peaking amplifier path. The amplifier stage 245 of the second peaking amplifier path 250 is biased to turn on at a second, higher input signal power threshold, which corresponds to an input signal power level at or near which the first peaking amplifier stage 244 reaches voltage saturation. Similarly, the amplifier stages of the subsequently ordered peaking amplifier paths (each referred to in sequence as the "next lower ordered" peaking amplifier path) are biased to turn on in sequence as the input power level increases, and finally the N-1th peaking amplifier stage 247 is biased to turn on at a highest input signal power threshold at or near which the amplifier stage 246 of the N-2th peaking path 260 reaches voltage saturation. The N-1th peaking amplifier path 270 also may be referred to herein as the "lowest-order" or "last" peaking amplifier path.

Stated another way, at low power levels, where the power of the input signal at node 202 is lower than the break points of all peaking amplifier stages 244-247, the amplifier 200 operates in a low-power (or N-1th back-off) mode in which the main amplifier stage 243 is the only amplifier supplying current to the load 206. The impedance of impedance transformer 283 (or $Z_{OO}$) determines the maximum VSWR the main amplifier stage 244 will be exposed to when all peaking amplifier stages 244-247 are in the off-state. When the power of the input signal exceeds the break point for the first peaking amplifier stage 244 (e.g., when the main amplifier stage 244 reaches voltage saturation), the amplifier 200 operates in a N-2th back-off mode in which the main amplifier stage 243 and the first peaking amplifier stage 244 both supply current to the load 206. At this point, the first peaking amplification path 240 provides active load modulation at the final summing node 273 via impedance transformer 284, allowing the current of the main amplifier stage 243 to continue to increase linearly.

The first peaking amplification path 240 continues to load modulate the main amplifier stage 243 until the first peaking amplifier stage 244 also reaches voltage saturation. At that point, which corresponds to a break point for the second peaking amplifier stage 245, the amplifier 200 operates in a N-3th back-off mode in which the main amplifier stage 243, the first peaking amplifier stage 244, and the second peaking amplifier stage 245 all supply current to the load 206. The second peaking amplifier stage 245 provides load modulation to the first peaking amplifier stage 244 at intermediate summing node 274 via impedance transformer 285. At the same time, the combined action of the first and second peaking amplifier stages 244, 245 provides load modulation to the main amplifier stage 243 at the final summing node 273 via impedance transformers 284 and 285, which further allows the current of the main amplifier stage 243 to increase linearly. As the power level increases successively beyond the break points of each of the remaining peaking amplifier stages 246, 247, each amplifier stage 246, 247 successively begins to supply current to the load 206 and to provide load modulation to upstream amplifier stages. Finally, when the power of the input signal exceeds the break points of all of the peaking amplifier stages 244-247, the amplifier 200 operates in a high-power mode in which the main amplifier stage 243 and all peaking amplifier stages 244-247 (including the lowest-order peaking amplifier stage 247) supply current to the load 206.

During operation in the high-power mode, an input signal received at input node 202 is divided (by power divider 208) into N signals, which are amplified separately along the main amplifier path 230 and the N-1 peaking amplifier paths 240, 250, 260, 270. Ultimately, and as will be described in more detail later, the amplified signals are then recombined (by combining network 272) and provided to the load 206 (e.g., an antenna) via the output node 204.

Power divider 208 is coupled between input node 202 and the RF amplifier device 220. Power divider 208 is configured to divide the input power of an input signal received at node 202 into multiple portions of the input signal, where respective portions of the input signal are provided to input terminals 223-227 of the RF amplifier device 220. For example, a first output of the power divider 208 may be coupled to the input terminal 223 corresponding to the main path 230, a second output of the power divider 208 may be coupled to the input terminal 224 corresponding to the first peaking path 240, a third output of the power divider 208 may be coupled to the input terminal 225 corresponding to the second peaking path 250, and so on. During operation in the high-power mode when the main and all peaking amplifier paths 230, 240, 250, 260, 270 are supplying current to the load 206, the power divider 208 divides the input signal power between the amplifier paths 230, 240, 250, 260, 270. For example, the power divider 208 may divide the power equally, such that roughly one Nth of the input signal power is provided to each path 230, 240, 250, 260, 270. Alternatively, the power divider 208 may divide the power unequally.

According to an embodiment, the power divider 208 includes a plurality of delay line elements 209-213 (e.g., transmission line segments and/or lumped elements), which impart various phase delays to the divided portions of the RF signal. According to an embodiment, starting with the phase delay imparted by the lowest-order delay line element 213 that is coupled to the lowest-order peaking amplifier path 270, the successively higher-order delay line elements 212, 211, 210, 209 coupled to each higher-order amplification path (i.e., each path that is successively closer to the main path 230) may impart an additional 90 degree phase delay to the signal received along that path. According to a more specific embodiment, for example, the first delay line element 209 along the main path 230 may impart a (N−1)×90 degree phase delay to the signal provided to path 230, the second delay line element 210 along the first peaking path (p1) 240 may impart a (N−2)×90 degree phase delay to the signal provided to path 240, the third delay line element 211 along the second peaking path (p2) 250 may impart a (N−3)×90 degree phase delay to the signal provided to path 250, and so on (for intermediate peaking paths, not illustrated), where the N-2th delay line element 212 along the N-2th peaking path (p(N-2)) 260 may impart a 90 degree phase delay to the signal provided to path 260, and the N−1th delay line element 213 along the N-1th peaking path (p(N−1)) 270 may impart no phase delay to the signal provided to path 270. In such an embodiment, delay line 213 may be excluded. Although an example of specific phase delays imparted by phase delay elements 209-213 is outlined above, there may be other solutions for input phasing. As would be understood by one of skill in the art based on the description herein, different solutions for input phasing would result in unique load impedance dispersion characteristics over the dynamic range. Regardless of the specifically applied phase delays, and as will be better understood later in the description, the phase delays imparted by the delay line elements 209-213 ensure that the amplified signals arriving at summing nodes 273-276 arrive in phase with each other, given additional delays imparted by elements of the output matching networks 253-257, 293-297, and the combining network 272.

The signals produced by the power divider 208 are conveyed through the PCB-level input matching networks 214-218 to the RF amplifier device 220. Essentially, each PCB-level input matching network 214-218 is configured to raise the impedance along each path 230, 240, 250, 260, 270 at input terminals (223-227) of the RF amplifier device 220 to a desired level at the input of the PCB level input matching networks 214-218 at the fundamental frequency (or carrier frequency), $F_O$, of the amplifier 200.

RF amplifier device 220 may be a discretely packaged electrical component, which is coupled to a PCB that includes other components of the amplifier 200 that are not contained within RF amplifier device 220. Accordingly, input and output terminals 223-227, 263-267 of RF amplifier device 220 represent the "package plane," or the interface between the device 220 and amplifier components that are external to device 220 (e.g., on the PCB to which device 220 is coupled). More specifically, the input and output terminals 223-227, 263-267 generally represent the package leads, pins, or other physical interfaces for providing electrical connections to the internal components (e.g., amplifier paths 230, 240, 250, 260, 270) of the RF amplifier device 220.

Although RF amplifier device 220 is depicted as a single unit (e.g., a single packaged device configured to be coupled to a PCB), those of skill in the art would understand, based on the description herein, that the components of each amplifier path 230, 240, 250, 260, 270 (or multiple amplifier paths) may be contained in separately packaged devices, as well. In another alternate embodiment, the components of RF amplifier device 220 may not be contained within distinct packaging. Instead, the components of the input pre-match networks 233-237, amplifier stages 243-247, and output pre-match networks 253-257 may be coupled directly to the PCB or other substrate that supports the other portions of Doherty amplifier 200. In such an embodiment, the PCB-level input matching networks 214-218 and the input pre-match networks 233-237 may be collapsed together into unified input matching networks. Similarly, the output pre-match networks 253-257 and the PCB-level output matching networks 293-297 may be collapsed together into unified output matching networks. In still other embodiments, various portions of the amplifier 200 may be integrated into the package that contains the amplifier stages 243-247, and/or incorporated into the semiconductor die(s) that include the amplifier stages 243-247. Such higher levels of integration into the package and/or die(s) could extend all the way to a fully-integrated amplifier, in which substantially all components between the amplifier input 202 and output 204 could be included in the same package and/or in the same semiconductor die.

Further, depending on the implementation, the PCB-level input and/or output matching networks 214-218, 293-297 may be optional. Similarly, the input and/or output pre-match networks 233-237, 253-257 may be optional. For example, a 50 Ohm in- and out-IC based amplifier stage would not need the PCB-level input or output matching networks 214-218, 293-297.

Within device 220, the main and peaking paths 230, 240, 250, 260, 270 each include an input pre-match network 233-237, an amplifier stage 243-247, and an output pre-match network 253-257 coupled in series between input terminals 223-227 and output terminals 263-267. In FIG. 2, "m" designates the main path 230, "p1" designates the first peaking path 240, "p2" designates the second peaking path 250, "p(N-2)" designates the N-2th peaking path 260, and "p(N−1)" designates the N-1th peaking path 270. According to an embodiment, each amplifier stage 243-247 is matched to a full power system impedance $R_O$ (e.g., 50 Ohms or some other value).

Each of the input pre-match networks 233-237 is configured to provide a desired input impedance at its respective input terminal 223-227 at $F_O$. Some or all of the input pre-match networks 233-237 may be realized as a low-pass matching network (e.g., a shunt capacitance matching network topology). In alternate embodiments, some or all of the input matching networks 233-237 may be realized as high-pass or band-pass matching networks.

Each of the output pre-match networks 253-257 is configured to provide a desired output impedance, at $F_O$, at its respective output terminal 263-267. In addition, a PCB-level output matching network 293-297 is coupled between each output terminal 263-267 and an input to combining network 272. Essentially, each PCB-level output matching network 293-297 is configured to raise the impedance along each path 230, 240, 250, 260, 270 even further. Some or all of the output pre-match networks 253-257 may be realized as a low-pass matching network (e.g., a shunt capacitance matching network topology). In alternate embodiments, some or all of the output pre-match networks 253-257 may be realized as high-pass or band-pass matching networks.

The output combining network 272 is coupled between the outputs of the PCB-level output matching networks 293-297 and output node 204. More specifically, the output combining network 272 connects the amplifier paths 230, 240, 250, 260, 270 to the final summing node 273, which in turn is coupled to the output node 204. Combining network 272 includes N inputs, N−1 summing nodes 273-276, N−1 impedance transformers 283-286, an offset line 287, and an output that is coupled to the amplifier output 204. The output terminals 263-267 of the device 220 each are coupled to an input to the combining network 272 through one of the PCB-level output matching networks 293-297.

Each series-coupled pre-match network 253-257, PCB-level output matching network 293-297, and impedance transformer 284-286 (or offset line 287) combination is designed to ensure correct phase relationships for optimal load modulation. More specifically, to ensure the correct phase to load modulate the main amplifier stage 243, the total phase delay imparted along the path between the output of amplifier stage 243 and the final summing node 273 (indicated by bracket 290) is about 90 degrees (i.e., m×90 degrees, where m=1). For each successive path (i.e., in order of path 240, 250, 260, 270), the total phase delay imparted along the path between the output of each amplifier stage 244, 245, 246, 247 and the final summing node 273 increases by about 90 degrees. For example, the total phase delay between the output of amplifier stage 244 and the final summing node 273 is about 180 degrees (i.e., m×90 degrees, where m=2), the total phase delay between the output of amplifier stage 245 and the final summing node 273 is about 270 degrees, and so on, where the total phase delay between the output of amplifier stage 246 and the final summing node 273 is about (N−1)×90 degrees, and the total phase delay between the output of amplifier stage 247 and the final summing node 273 is about N×90 degrees.

According to an embodiment, the output matching network for the main amplification path 230 (i.e., consisting of pre-match network 253 in series with PCB-level output matching network 293) is configured to provide an impedance transformation to a desired impedance looking toward the final summing node 273 (e.g., 50 Ohms at high-power for $R_0$=50 Ohms). In addition, the output matching network for the main amplification path 230 provides a single impedance inversion, in an embodiment, and thus is designed to impart about 90 degrees of phase delay to the RF signal between the output of amplifier stage 243 and the final summing node 273. To achieve the 90 degree phase delay, some embodiments of the output matching network for the main amplification path 230 may include a phase lead network, which applies negative phase to the overall network. For example, in an embodiment in which the output pre-match network 253 includes a high pass filter (e.g., an inductance to ground that resonates with the drain-source capacitance of amplifier stage 243), the dominance of the network may define the magnitude of negative phase applied to the overall network. In addition or alternatively, a matched high-pass filter (e.g., with one or more shunt inductors (or transmission lines) with AC coupling to ground and one or more series capacitors) may be coupled in series with the PCB-level output matching network 293 (e.g., with the input terminal of the high-pass filter coupled to the output of the network 293, and the output terminal of the high-pass filter coupled to the final summing node 273). Alternatively, the high-pass filter may be un-matched and simplified by omitting the shunt inductance to ground and only incorporating a series capacitor, in which case the series capacitor is absorbed into the output matching network. In addition or alternatively, a shunt inductor with AC coupling to ground may be placed in close proximity to the output terminal 263 on the PCB (e.g., this may be implemented by using a power supply transmission line feed with an electrical length less than a quarter wavelength at $F_0$). In such an embodiment, the shunt inductance is absorbed into the output matching network.

The output matching networks of each of the peaking amplification paths 240, 250, 260 may be similarly designed, according to an embodiment, to provide a single impedance inversion and 90 degree phase delay between the output of each amplifier stage 244-246 and the nearest local summing node 274-276. As used herein, the term "nearest local summing node" means the summing node that is electrically the closest to any particular amplifier stage output. According to an embodiment, for the N−1th peaking path 270, a 90 degree phase delay may be provided by the output matching network between the output of amplifier stage 247 and node 277, which is not technically a "summing node." In stark contrast to the Doherty amplifier 100 (FIG. 1), it can be seen that the combining network 272 does not include offset lines associated with N−1 of the paths (e.g., offset lines 166-167, FIG. 1) or distinct impedance inverters (e.g., 90 degree impedance inverters 183-184, FIG. 1). Instead, the output matching networks 253-256, 293-296 for the main and first N-2 peaking paths 230, 240, 250, 260 perform a dual role of impedance inversion and impedance transformation. The output matching network 257, 297 for the N−1th peaking path 270 performs impedance transformation, but not necessarily impedance inversion (although it may).

As mentioned above, and according to various embodiments, a minimum phase output combining network 272 is achieved by excluding the customary 90 degree impedance inverters and offset lines used in N−1 of the output network branches of a conventional N-way Doherty amplifier. The output combining network 272 includes N combining network inputs, a combining network output, a final summing node 273 coupled to the combining network output and to a first combining network input, N-2 intermediate summing nodes each coupled to a different one of N-2 other combining network inputs, N-2 impedance transformers each coupled between two different adjacent summing nodes 273-276, and an offset line coupled between a lowest-order combining network input and a lowest-order summing node 276. As used herein, "adjacent summing nodes" means a set of two summing nodes that are electrically closest to each other. For example, nodes 273 and 274 constitute adjacent summing nodes, nodes 274 and 275 constitute adjacent summing nodes, and so on. Also as used herein, the "lowest-order summing node" refers to the summing node (e.g., node 276) that is electrically closest to the lowest-order peaking amplifier path (e.g., path 270). Finally, the "lowest-order combining network input" refers to the combining network input to which the lowest-order peaking amplifier path (e.g., path 270) is directly coupled.

According to an embodiment, the combining network 272 implements no significant additional phase delay (i.e., approximately 0 degrees of phase delay) between the PCB-level output matching network 293 and the final summing node 273. Each of the N−1 impedance transformers 283-286 impart about 90 degrees of phase delay to signals passing through the transformers 283-286. Accordingly, the combining network 272 imparts phase delays of about (n)×90 degrees (n=1, 2, 3, . . . , N-2) between the output of each of the N-2 peaking paths 240, 250, 260 and the final summing node 273. For the N-1th peaking path 270 (or the "lowest-order peaking path"), between the output of PCB-level output matching network 297 and the final summing node 273, the combining network 272 implements a phase delay of about (N-2)×90 degrees plus an additional phase delay from offset line 287. The phase delay imparted by offset line 287 may be about 90 degrees, or whatever other value is sufficient to achieve an optimal off-state for peaking path 270 at the lowest back-off threshold.

Said another way, each of the peaking amplifier paths 240, 250, 260, 270 is coupled to the final summing node 273 through a series combination (or cascade) of one or more impedance transformers 284-286 and (for path 270) offset line 287. For example, each of peaking amplifier paths 240, 250, 260 is coupled to the final summing node 273 through incrementally more impedance transformers 284-286, depending on the order in which each peaking amplifier path 240, 250, 260 is turned on. More specifically, peaking path 240 is coupled to the final summing node 273 through one impedance transformer 284, peaking path 250 is coupled to the final summing node 273 through two impedance transformers 284, 285, peaking path 260 is coupled to the final summing node 273 through N-2 impedance transformers 284-286, and peaking path 270 is coupled to the final summing node 273 through N-2 impedance transformers 284-286 plus offset line 287.

According to an embodiment, the final summing node 273 may be connected to the output load 206 through an additional impedance transformer 283, referred to herein as an "output transformer," to provide a desired VSWR for load-modulation. For example, the impedance transformer 283 may provide an additional 90 degrees of phase delay to the combined signal from the final summing node 273. Alternatively, if the impedance looking from the final summing node 273 toward the load, indicated by arrow 288, is equal to the load impedance $R_{load}$, impedance transformer 283 may be excluded. For example, this condition may occur if, for example, $R_0$ is set to 50×N when $R_{load}$ equals 50 Ohms. In such an embodiment, the final summing node 273 may be considered to be the output node of the amplifier 200.

Output transformer 283 may also be composed of multiple transformer sections or alternative transformer implementations to increase the bandwidth of the desired VSWR for load-modulation. For example, various embodiments of output transformer 283 may include a multi-section binomial transformer, a Tchebycheff transformer and Klopfenstein Taper, in which case output transformer 283 may impart an additional delay to the combined signal from the final summing node 273, in accordance with the specific output transformer design.

According to an embodiment, the various impedance transformers 283, 284, 285, 286 and offset line 287 may have characteristic impedances, $Z_{00}$, $Z_{01}$, $Z_{02}$, . . . , $Z_{0(N-2)}$, $Z_{0(N-1)}$, respectively, that are defined according to the following equations:

$Z_{00} = \sqrt{50 \times R_0/N}$;

$Z_{01} = R_0/(N-1)$;

$Z_{02} = R_0/(N-2)$; . . .

$Z_{0(N-2)} = R_0/2$; and $Z_{0(N-1)} = R_0$.

When amplifier 200 is operating in the lowest-power mode, the impedance observed by output matching network 293 looking toward the final summing node 273 is about $R_0/N$, and the impedance observed by each of the output matching networks 294-297 looking toward the nearest local summing nodes 274-276 (or toward node 277) is essentially infinite. As the power level of the input signal increases above a first break point at which the first peaking path 240 begins to provide current to the load 206, load modulation of the main amplifier stage 243 begins to occur, the impedance observed by output matching network 293 increases, and a relatively low impedance is observed by output matching network 294 looking toward summing node 274. As the power level of the input signal continues to increase above a second break point at which the second peaking path 250 also begins to provide current to the load 206, load modulation of the main amplifier stage 243 continues, the impedance observed by output matching networks 293 and 294 increase, and a relatively low impedance is observed by output matching network 295 looking toward summing node 275. This trend continues as the power level of the input signal continues to increase beyond each successively higher break point, until the high-power mode (e.g., normalized to zero decibel (dB) input signal power) is reached when all amplifier stages are operating in saturation. At that point, the impedances observed by each of the output matching networks 293-297 looking toward their nearest local summing nodes 273-276 (or node 277) reaches their highest levels (e.g., about $R_0$).

Each impedance transformer 284-286 (and offset line 287) is designed to ensure correct amplitude and phase relationships for optimal load modulation, in an embodiment. When all paths 230, 240, 250, 260, 270 are supplying current to the load 206:

the peaking RF signal produced by output matching network 297 is conducted through offset line 287 to intermediate summing node 276, where it is reactively combined, in phase, with the peaking RF signal produced by output matching network 296. According to an embodiment, offset line 287 imparts a 90 degree phase delay (or another delay as needed for off-state) to the RF signal produced by output matching network 297;

the combined signal at intermediate summing node 276 is conducted through impedance transformer 286 to the next highest intermediate summing node, where it is reactively combined, in phase, with the peaking RF signal produced at the output of the next highest peaking amplifier path. According to an embodiment, impedance transformer 286 imparts a 90 degree phase delay to the RF signal produced at summing node 276. Although one or more peaking amplifier paths may be included between paths 250 and 260, for ease of description, the next highest peaking path will be assumed to be path 250. Accordingly, after being conducted through impedance transformer 286, the combined signal from summing node 276 is reactively combined at intermediate summing node 275 with the peaking RF signal produced by output matching network 295;

the combined signal at intermediate summing node 275 is conducted through 90 degree impedance transformer 285 to intermediate summing node 274, where it is reactively combined, in phase, with the peaking RF signal produced by output matching network 294. According to an embodiment, impedance transformer 285 imparts a 90 degree phase delay to the RF signal produced at summing node 275;

the combined signal at intermediate summing node 274 is conducted through 90 degree impedance transformer 284 to final summing node 273, where it is reactively combined, in phase, with the main RF signal produced by output matching network 293. According to an embodiment, impedance transformer 284 imparts a 90 degree phase delay to the RF signal produced at summing node 274; and finally, the combined signal at summing node 273 is conducted through impedance transformer 283 to the output node 204. According to an embodiment, impedance transformer 283 imparts a 90 degree phase delay (or another phase delay, depending on the specific output transformer design) to the RF signal produced at summing node 273.

Power divider 208, RF amplifier device 220, impedance matching networks 293-297, and combining network 272 are designed so that the total phase shifts applied along the amplifier paths 230, 240, 250, 260, 270 ensure that the currents ultimately provided to summing nodes 273-276 by the respective amplifier paths 230, 240, 250, 260, 270 are received substantially in-phase with each other. Accordingly, during high-power operation, the current provided by summing node 273 to impedance transformer 283 and output node 204 (and to load 206) represents the in-phase summation of the currents provided by amplifier paths 230, 240, 250, 260, 270.

In the Doherty amplifier 200, the exclusion of conventional offset lines, impedance inverters (e.g., offset lines 166-167, and impedance inverters 183-184, FIG. 1) may enhance the RF bandwidth performance of the amplifier 200, as well as enabling a significant reduction in the PCB area occupied by the output combining network 272. It should be understood that FIG. 2 is a simplified representation of an amplifier 200 for purposes of explanation and ease of description, and that practical embodiments may include other devices and components to provide additional functions and features, and/or the amplifier 200 may be part of a much larger electrical system, as will be understood. Thus, although FIG. 2 depicts direct electrical connections between circuit elements and/or terminals, alternative embodiments may employ intervening circuit elements and/or components while functioning in a substantially similar manner.

The amplifier 200 of FIG. 2 represents a generalized embodiment of an N-way Doherty amplifier, where N may be any number greater than or equal to 3. As a more concrete example, a 4-way Doherty amplifier 300, which is derived from the N-way Doherty amplifier of FIG. 2, will now be described in conjunction with FIG. 3. For brevity, some of the details discussed above are excluded from the description of the 4-way Doherty amplifier 300. However, it is to be understood that such details apply also to the 4-way Doherty amplifier 300.

FIG. 3 is a simplified schematic diagram of a 4-way Doherty amplifier 300, in accordance with an embodiment. More specifically, amplifier 300 is a 4-way, inverted Doherty amplifier that includes an input node 302, a 4-way power divider and phase shift network 310, four PCB-level input matching networks 315-318, an RF amplifier device 320 with a main amplifier path 330 and three peaking amplifier paths 340, 350, 360, four PCB-level output matching networks 367-370, an output combining network 372, and an output node 304. Each amplification path includes an amplifier stage 343-346 for amplifying an RF signal conducted through the path. Although the power transistor ICs may be of equal size, the power transistor ICs may have unequal sizes, as well.

During operation of Doherty amplifier 300, amplifier stage 343 is biased to operate in class AB mode, and amplifier stages 344-346 are biased to operate in different class C modes. According to various embodiments, the amplifier stages 343-346 may be asymmetrical or symmetrical.

According to an embodiment, the amplifier stage 344 of the first peaking amplifier path 340 is biased to turn on at a first input signal power threshold, which corresponds to an input signal power level at or near which the main amplifier stage 343 reaches voltage saturation. The amplifier stage 345 of the second peaking amplifier path 350 is biased to turn on at a second, higher input signal power threshold, which corresponds to an input signal power level at or near which the first peaking amplifier stage 344 reaches voltage saturation. Similarly, the amplifier stage 346 of the third peaking amplifier path 360 is biased to turn on at a highest input signal power threshold at or near which the second peaking amplifier stage 345 reaches voltage saturation.

Stated another way, at low power levels, where the power of the input signal at node 302 is lower than the break points of all peaking amplifier stages 344-346, the amplifier 300 operates in a low-power (or third back-off) mode in which the main amplifier stage 343 is the only amplifier supplying current to the load 306. The characteristic impedance of impedance transformer 383 (or $Z_{OO}$) determines the maximum VSWR the main amplifier stage 343 will be exposed to when all peaking amplifier stages 344-346 are in the off-state. When the power of the input signal exceeds the break point for the first peaking amplifier stage 344, the amplifier 300 operates in a second back-off mode in which the main amplifier stage 343 and the first peaking amplifier stage 344 both supply current to the load 306. At this point, the first peaking amplification path 340 provides active load modulation at the final summing node 373 via impedance transformer 384, allowing the current of the main amplifier stage 343 to continue to increase linearly.

The first peaking amplification path 340 continues to load modulate the main amplifier stage 343 until the first peaking amplifier stage 344 also reaches voltage saturation. At that point, which corresponds to a break point for the second peaking amplifier stage 345, the amplifier 300 operates in a first back-off mode in which the main amplifier stage 343, the first peaking amplifier stage 344, and the second peaking amplifier stage 345 all supply current to the load 306. The second peaking amplifier stage 345 provides load modulation to the first peaking amplifier stage 344 at intermediate summing node 374 via impedance transformer 385. At the same time, the combined action of the first and second peaking amplifier stages 344, 345 provides load modulation to the main amplifier stage 343 at the final summing node 373 via impedance transformers 384 and 385, which further allows the current of the main amplifier stage 343 to increase linearly.

The first and second peaking amplification paths 340, 350 continue to load modulate the main amplifier stage 343 until the second peaking amplifier stage 345 also reaches voltage saturation. At that point, which corresponds to a break point for the third peaking amplifier stage 346, the amplifier 300 operates in a high-power mode in which the main amplifier stage 343, and all the peaking amplifier stages 344-346 all supply current to the load 306. The third peaking amplifier stage 346 provides load modulation to the second peaking amplifier stage 345 at intermediate summing node 375 via offset line 386. At the same time, the combined action of the three peaking amplifier stages 344-346 provides load modulation to the main amplifier stage 343 at the final summing node 373 via impedance transformers 384-385 (or offset line 386), which further allows the current of the main amplifier stage 343 to increase linearly. Essentially, as each successive peaking stage is turned on, it also allow the current of each higher order peaking stage to continue to increase linearly.

Power divider 310 is coupled between input node 302 and the RF amplifier device 320. Power divider 310 is configured to divide the input power of an input signal received at node 302 into multiple portions of the input signal, where respective portions of the input signal are provided to input terminals 323-326 of the RF amplifier device 320. During operation in the high-power mode when the main and all peaking amplifier paths 330, 340, 350, 360 are supplying current to the load 306, the power divider 310 divides the input signal power between the amplifier paths 330, 340, 350, 360. For example, the power divider 310 may divide the power equally, such that roughly one fourth of the input signal power is provided to each path 330, 340, 350, 360. Alternatively, the power divider 310 may divide the power unequally.

According to an embodiment, the power divider 310 includes delay line elements 311-314 (e.g., transmission line segments and/or lumped elements), which impart various phase delays to the divided portions of the RF signal. According to an embodiment, for example, the first delay line element 311 along the main path 330 may impart about a 270 degree phase delay to the signal provided to path 330, the second delay line element 312 along the first peaking path 340 may impart about a 180 degree phase delay to the signal provided to path 340, the third delay line element 313 along the second peaking path 350 may impart about a 90 degree phase delay to the signal provided to path 350, and the fourth delay line element 314 along the third peaking path 360 may impart no phase delay to the signal provided to path 370. In such an embodiment, delay line 314 may be excluded. Although an example of specific phase delays imparted by phase delay elements 311-314 is outlined above, there may be other solutions for input phasing. Regardless of the specifically applied phase delays, the phase delays imparted by the delay line elements 311-314 ensure that the amplified signals arriving at summing nodes 373-375 arrive in phase with each other, given additional delays imparted by elements of the output matching networks 353-356, 367-370, and the combining network 372.

The signals produced by the power divider 310 are conveyed through the PCB-level input matching networks 315-318 to the RF amplifier device 320. Essentially, each PCB-level input matching network 315-318 is configured to raise the impedance along each path 330, 340, 350, 360 at input terminals (323-326) of the RF amplifier device 320 to a desired level at the input of PCB-level matching networks 315-318 at the fundamental frequency (or carrier frequency), $F_0$, of the amplifier 300.

RF amplifier device 320 may be a discretely packaged electrical component, which is coupled to a PCB that includes other components of the amplifier 300 that are not contained within RF amplifier device 320. Accordingly, the input and output terminals 323-326, 363-366 generally represent the package leads, pins, or other physical interfaces for providing electrical connections to the internal components (e.g., amplifier paths 330, 340, 350, 360) of the RF amplifier device 320. Although RF amplifier device 320 is depicted as a single unit, those of skill in the art would understand, based on the description herein, that the components of each amplifier path 330, 340, 350, 360 (or multiple amplifier paths) may be contained in separately packaged devices, as well. In another alternate embodiment, the components of RF amplifier device 320 may not be contained within distinct packaging. Instead, the components of the input pre-match networks 333-336, amplifier stages 343-346, and output pre-match networks 353-356 may be coupled directly to the PCB or other substrate that supports the other portions of Doherty amplifier 300. In such an embodiment, the PCB-level input matching networks 315-318 and the input pre-match networks 333-336 may be collapsed together into unified input matching networks. Similarly, the output pre-match networks 353-356 and the PCB-level output matching networks 367-370 may be collapsed together into unified output matching networks. In still other embodiments, various portions of the amplifier 300 may be integrated into the package that contains the amplifier stages 343-346, and/or incorporated into the semiconductor die(s) that include the amplifier stages 343-346. Such higher levels of integration into the package and/or die(s) could extend all the way to a fully-integrated amplifier, in which substantially all components between the amplifier input 302 and output 304 could be included in the same package and/or in the same semiconductor die.

Further, depending on the implementation, the PCB-level input and/or output matching networks 315-318, 367-370 may be optional. Similarly, the input and/or output pre-match networks 333-336, 353-356 may be optional. For example, a 50 Ohm in- and out-IC based amplifier stage would not need the PCB-level input or output matching networks 315-318, 367-370.

Within device 320, the main and peaking paths 330, 340, 350, 360 each include an input pre-match network 333-336, an amplifier stage 343-346, and an output pre-match network 353-356 coupled in series between input terminals 323-326 and output terminals 363-366. In FIG. 3, "m" designates the main path 330, "p1" designates the first peaking path 340, "p2" designates the second peaking path 350, and "p3" designates the third peaking path 360. According to an embodiment, each amplifier stage 343-346 is matched to a full power system impedance $R_0$ (e.g., 50 Ohms or some other value).

The output combining network 372 is coupled between the outputs of the PCB-level output matching networks 367-370 and output node 304. More specifically, the output combining network 372 connects the amplifier paths 330, 340, 350, 360 to the final summing node 373, which in turn is coupled to the output node 304. Combining network 372 includes four inputs, three summing nodes 373-375, three impedance transformers 383-385, an offset line 386, and an output that is coupled to the amplifier output 304. The output terminals 363-366 of the device 320 each are coupled to an input to the combining network 372 through one of the PCB-level output matching networks 367-370.

Each series-coupled output pre-match network 353-356, PCB-level output matching network 367-370, and impedance transformer 384-385 (or offset line 386) combination is designed to ensure correct phase relationships for optimal load modulation. To achieve correct load modulation, each amplifier stage 343-345 is about 90 degrees from the nearest local summing node 373-375. In this way, the main amplifier stage 343 is properly load modulated by the first peaking amplifier stage 344 in the second back-off mode, the first peaking amplifier stage 344 is properly load modulated by the second peaking amplifier stage 345 in the first back-off mode, and the second peaking amplifier stage 345 is properly load modulated by the third peaking amplifier stage 346 in the high-power mode. Of course, as the power of the input signal is successively increased, the main amplifier stage 343 is first load modulated by the first peaking amplifier stage 344, then the second peaking amplifier stage 345 load modulates the first peaking amplifier stage 344, whilst the combination of the second peaking amplifier stage 345 and the first peaking amplifier stage 344 also load modulate the main amplifier stage 343. Finally, the third peaking amplifier stage 346 then load modulates the second peaking amplifier stage 345, whilst the combination of the third and second peaking amplifier stages 346, 345 load modulate the first peaking amplifier stage 344, and whilst the combination of the third, second, and first peaking amplifier stages 346, 345, 344 load modulate the main amplifier stage 343. More specifically, to ensure the correct phase to load modulate the main amplifier stage 343, the total phase delay imparted along the path between the output of amplifier stage 343 and the final summing node 373 is about 90 degrees. The total phase delay between the output of amplifier stage 344 and the final summing node 373 is about 180 degrees, the total phase delay between the output of amplifier stage 345 and the final summing node 373 is about 270 degrees, and the total phase delay between the output of amplifier stage 346 and the final summing node 373 is about 360 degrees.

According to an embodiment, the output matching network for the main amplification path 330 (i.e., consisting of pre-match network 353 in series with PCB-level output matching network 367) is configured to provide an impedance transformation to a desired impedance looking toward the final summing node 373 (e.g., 50 Ohms at high-power for $R_O$=50 Ohms). In addition, the output matching network for the main amplification path 330 provides a single impedance inversion, in an embodiment, and thus is designed to impart about 90 degrees of phase delay to the RF signal between the output of amplifier stage 343 and the final summing node 373.

The output matching networks of each of the first and second peaking amplification paths 340, 350 may be similarly designed, according to an embodiment, to provide a single impedance inversion and 90 degree phase delay between the output of each amplifier stage 344, 345 and the nearest local summing node 374, 375. According to an embodiment, for the third peaking path 360, a single impedance inversion and 90 degree phase delay may (or may not) be provided by the output matching network between the output of amplifier stage 346 and node 376, which is not technically a "summing node." The output matching networks 353-355, 367-369 for the main and first two peaking paths 330, 340, 350 perform a dual role of impedance inversion and impedance transformation. The output matching network 356, 370 for the third peaking path 360 performs impedance transformation, but not necessarily impedance inversion (although it may).

According to an embodiment, the combining network 372 implements no significant additional phase delay (i.e., approximately 0 degrees of phase delay) between the PCB-level output matching network 367 and the final summing node 373. Each of the three impedance transformers 383-385 impart about 90 degrees of phase delay to signals passing through the transformers 383-385. Accordingly, the combining network 372 imparts phase delays of about (n)×90 degrees (n=1, 2) between the output of each of the first and second peaking paths 340, 350 and the final summing node 373. For the third peaking path 360, between the output of PCB-level output matching network 370 and the final summing node 373, the combining network 372 implements a phase delay of about 180 degrees plus an additional phase delay from offset line 386. The phase delay imparted by offset line 386 may be about 90 degrees, or whatever other value is sufficient to achieve an off-state for peaking path 360 at the highest back-off threshold.

According to an embodiment, the final summing node 373 may be connected to the output load 306 through an additional impedance transformer 383 to provide a desired VSWR for load-modulation. For example, the impedance transformer 383 may add an additional 90 degrees of phase delay to the combined signal from the final summing node 373. Alternatively, if the impedance looking from the final summing node 373 toward the load, indicated by arrow 388, is equal to the load impedance $R_{load}$, impedance transformer 383 may be excluded. For example, this condition may occur if, for example, $R_O$ is set to 50×N (where N=4 in an embodiment) when $R_{load}$ equals 50 Ohms. In such an embodiment, the final summing node 373 may be considered to be the output node of the amplifier 300.

When amplifier 300 is operating in the lowest-power mode, the impedance (indicated by arrow 391) observed by output matching network 367 looking toward the final summing node 373 is about $R_O$/N, and the impedances (indicated by arrows 392-394) observed by each of the output matching networks 368-370 looking toward the nearest local summing nodes 374-375 (or toward node 376) are essentially infinite.

As the power level of the input signal increases above a first break point at which the first peaking path 340 begins to provide current to the load 306, load modulation of the main amplifier stage 343 begins to occur, the impedance observed by output matching network 367 increases, and a relatively low impedance is observed by output matching network 368 looking toward summing node 374. The impedances (indicated by arrows 393-394) observed at the output matching networks 369 and 370 looking toward the nearest local summing node 375 (or toward node 376) are essentially infinite.

As the power level of the input signal continues to increase above a second break point at which the second peaking path 350 also begins to provide current to the load 306, load modulation of first peaking stage 344 begins to occur and load modulation of the main amplifier stage 343 continues, the impedances observed by output matching networks 367 and 368 increase, and a relatively low impedance is observed by output matching network 369 looking toward summing node 375. The impedance indicated by arrow 394 observed at the output matching network 370 looking toward node 376 is essentially infinite.

Finally, after the power level of the input signal increases beyond the third break point and to the high-power mode, the impedances observed by each of the output matching networks 367-370 looking toward their nearest local summing nodes 373-375 (or node 376) reach a level of about $R_O$.

Each impedance transformer 384-385 (or offset line 386) is designed to ensure correct phase relationships for optimal load modulation, in an embodiment. When all paths 330, 340, 350, 360 are supplying current to the load 306:

the peaking RF signal produced by output matching network 370 is conducted through offset line 386 to intermediate summing node 375, where it is reactively combined, in phase, with the peaking RF signal produced by output matching network 369. According to an embodiment, offset line 386 imparts a 90 degree phase delay (or another delay as needed for off-state) to the RF signal produced by output matching network 370;

the combined signal at intermediate summing node 375 is conducted through 90 degree impedance transformer 385 to intermediate summing node 374, where it is reactively combined, in phase, with the peaking RF signal produced by output matching network 368. According to an embodiment, impedance transformer 385 imparts a 90 degree phase delay to the RF signal produced at summing node 375;

the combined signal at intermediate summing node 374 is conducted through 90 degree impedance transformer 384 to final summing node 373, where it is reactively combined, in phase, with the main RF signal produced by output matching network 367. According to an embodiment, impedance transformer 384 imparts a 90 degree phase delay to the RF signal produced at summing node 374; and finally, the combined signal at summing node 373 is conducted through impedance transformer 383 to the output node 304. According to an embodiment, impedance transformer 383 imparts a 90 degree phase delay to the RF signal produced at summing node 373.

Power divider 310, RF amplifier device 320, impedance matching networks 393-396, and combining network 372 are designed so that the total phase shifts applied along the amplifier paths 330, 340, 350, 360 ensure that the currents ultimately provided to summing nodes 373-375 by the respective amplifier paths 330, 340, 350, 360 are received substantially in-phase with each other. Accordingly, during high-power operation, the current provided by summing node 373 to impedance transformer 383 and output node 304 (and to load 306) represents the in-phase summation of the currents provided by amplifier paths 330, 340, 350, 360.

FIGS. 4-7 are Smith charts 400, 500, 600, 700 illustrating load impedance trajectories for the main and peaking amplifier stages 343-346, respectively, of the 4-way Doherty amplifier of FIG. 3 as the input signal power is driven from a low power level to a high-power level. More specifically, the traces track the load impedance, $Z_c$ (arrow 331, FIG. 3), $Z_{p1}$ (arrow 341, FIG. 3), $Z_{p2}$ (arrow 351, FIG. 3), and $Z_{p3}$ (arrow 361, FIG. 3) as seen from each amplifier path output terminal 363-366 (at the device reference plane) looking toward the load 306. Three traces are shown for each amplifier stage 343-346, with the center trace tracking the load impedance trajectory at the center frequency, $F_0$, and the other traces tracking the load impedance trajectories at lower and higher in-band frequencies.

Trace ends 410, 510, 610, 710 correspond to the load impedances at low input signal power (at which only amplifier stage 343 is providing current to the load 306), and trace ends 420, 520, 620, 720 correspond to the load impedances at full input signal power (at which all amplifier stages 343-346 are providing current to the load 306). Chart 400 shows that, according to the principles of Doherty amplifier operation, amplifier 300 achieves continuous, uninterrupted, and appropriate load modulation of the main amplifier stage 343 across the entire power dynamic range. In other words, amplifier 300 achieves correct linear operation according to the principles of Doherty amplifier operation.

An embodiment of a Doherty amplifier includes an output combining network, a main amplifier path, and N−1 peaking amplifier paths. The output combining network has N combining network inputs, multiple summing nodes, and a combining network output, where N is an integer greater than two, and the output combining network is configured to combine signals received at the N combining network inputs into a combined signal that is provided at the combining network output. The main amplifier path has an output coupled to a first combining network input of the N combining network inputs. The main amplifier path includes a main amplifier stage and a first output matching network coupled to an output of the main amplifier stage. The first output matching network imparts a phase delay of 90 degrees and provides a single impedance inversion to a first RF signal conveyed through the main amplifier path. Each of the N−1 peaking amplifier paths has an output that is coupled to one of N−1 different combining network inputs of the N combining network inputs, and each of the N−1 peaking amplifier paths includes a peaking amplifier stage and an output matching network coupled to an output of the peaking amplifier stage. The output matching network of each of N-2 of the peaking amplifier paths imparts a phase delay of 90 degrees and provides a single impedance inversion to an RF signal conveyed through each of the N-2 peaking amplifier paths. A lowest-order peaking amplifier path is coupled to a lowest-order combining network input of the N combining network inputs. The multiple summing nodes of the output combining network include a final summing node and N-2 intermediate summing nodes. The final summing node is coupled to the combining network output and is directly coupled to the first combining network input. The N-2 intermediate summing nodes each are directly coupled to a different one of N-2 other combining network inputs of the N combining network inputs. The output combining network further includes N-2 impedance transformers each coupled between different sets of adjacent summing nodes of the multiple summing nodes, and an offset line coupled between the lowest-order combining network input and a lowest-order summing node of the N-2 intermediate summing nodes.

Another embodiment of a Doherty amplifier includes an output combining network, a main amplifier path, and first, second, and third peaking amplifier paths. The output combining network has first, second, third, and fourth combining network inputs, a combining network output, a first summing node directly coupled to the first combining network input, a second summing node directly coupled to the second combining network input, a third summing node directly coupled to the third combining network input, a first impedance transformer coupled between the first and second summing nodes, a second impedance transformer coupled between the second and third summing nodes, and an offset line coupled between the fourth combining network input and the third summing node. The output combining network is configured to combine signals received at the combining network inputs into a combined signal that is provided at the combining network output. The main amplifier path has an output coupled to the first combining network input. The main amplifier path includes a main amplifier stage and a main output matching network coupled to an output of the main amplifier stage. The main output matching network imparts a phase delay of 90 degrees and provides a single impedance inversion to a main RF signal conveyed through the main amplifier path. The first, second, and third peaking amplifier paths each have an output coupled to a different one of the second, third, and fourth combining network inputs. Each of the peaking amplifier paths includes a peaking amplifier stage and a peaking output matching network coupled to an output of the peaking amplifier stage. Each of a first and second peaking output matching network of the first and second peaking amplifier paths imparts a phase delay of 90 degrees and provides a single impedance inversion to a peaking RF signal conveyed through the first and second peaking amplifier paths to which each of the first and second peaking output matching network is coupled.

Another embodiment of a Doherty amplifier includes a main amplifier path with an input and an output, N−1 peaking amplifier paths (where N is greater than two), and an output network. Each peaking amplifier path has an input and an output. The output combining network has a combining network output, N combining network inputs, multiple summing nodes, and an offset line. For the N combining network inputs, a first combining network input is coupled to the output of the main amplifier path, a lowest-order combining network input is coupled to a lowest-order peaking amplifier path of the N−1 peaking amplifier paths, and N-2 additional combining network inputs are coupled to other paths of the N−1 peaking amplifier paths. The multiple summing nodes include a final summing node coupled to the combining network output and directly coupled to the first combining network input, and N-2 intermediate summing nodes each directly coupled to a different one of the N-2 additional combining network inputs. The offset line is coupled between the lowest-order combining network input and a lowest-order summing node of the N-2 intermediate summing nodes. A longest phase delay imparted by the output combining network on a peaking RF signal between the lowest-order combining network input and the final summing node is greater than all other phase delays imparted by the output combining network on any other RF signal provided to the first combining network input and the N-2 additional combining network inputs.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A Doherty amplifier comprising:
    an output combining network with N combining network inputs, multiple summing nodes, and a combining network output, wherein N is an integer greater than two, and the output combining network is configured to combine signals received at the N combining network inputs into a combined signal that is provided at the combining network output;
    a main amplifier path with an output coupled to a first combining network input of the N combining network inputs, wherein the main amplifier path includes a main amplifier stage and a first output matching network coupled to an output of the main amplifier stage, and wherein the first output matching network imparts a phase delay of 90 degrees and provides a single impedance inversion to a first RF signal conveyed through the main amplifier path; and
    N−1 peaking amplifier paths, wherein each peaking amplifier path has an output that is coupled to one of N−1 different combining network inputs of the N combining network inputs, and wherein each of the N−1 peaking amplifier paths includes a peaking amplifier stage and an output matching network coupled to an output of the peaking amplifier stage, wherein the output matching network of each of N-2 of the peaking amplifier paths imparts a phase delay of 90 degrees and provides a single impedance inversion to an RF signal conveyed through each of the N-2 peaking amplifier paths, and wherein a lowest-order peaking amplifier path is coupled to a lowest-order combining network input of the N combining network inputs, and
    wherein the multiple summing nodes of the output combining network include a final summing node and N-2 intermediate summing nodes, wherein the final summing node is coupled to the combining network output and is directly coupled to the first combining network input, the N-2 intermediate summing nodes each are directly coupled to a different one of N-2 other combining network inputs of the N combining network inputs, and
    wherein the output combining network further includes N-2 impedance transformers each coupled between different sets of adjacent summing nodes of the multiple summing nodes, and an offset line coupled between the lowest-order combining network input and a lowest-order summing node of the N-2 intermediate summing nodes.

2. The Doherty amplifier of claim 1, further comprising:
an N-way power divider that includes a power divider input and N power divider outputs, wherein each of the N power divider outputs is coupled to one path of the main amplifier path and the N−1 peaking amplifier paths, and the N-way power divider is configured to divide an input power of an input RF signal received at the power divider input into N portions of the input RF signal, and to provide the N portions of the input RF signal to the N power divider outputs.

3. The Doherty amplifier of claim 2, wherein the N-way power divider further includes a plurality of delay line elements, which impart various phase delays to the N portions of the input RF signal, wherein, starting with a lowest-order delay line element that is coupled to an input to the lowest-order peaking amplifier path, successively higher-order delay line elements each impart an additional 90 degree phase delay to the portions of the input RF signal received by each of the delay line elements.

4. The Doherty amplifier of claim 1, further comprising N input matching networks, wherein each of the N input matching networks is coupled to an input to one of the main amplifier stage and the N−1 peaking amplifier stages.

5. The Doherty amplifier of claim 1, wherein the output combining network further includes an additional impedance transformer coupled between the final summing node and the combining network output.

6. The Doherty amplifier of claim 1, wherein N equals 3.

7. The Doherty amplifier of claim 1, wherein N is equal to or greater than 4.

8. A Doherty amplifier comprising:
an output combining network with first, second, third, and fourth combining network inputs, a combining network output, a first summing node directly coupled to the first combining network input, a second summing node directly coupled to the second combining network input, a third summing node directly coupled to the third combining network input, a first impedance transformer coupled between the first and second summing nodes, a second impedance transformer coupled between the second and third summing nodes, and an offset line coupled between the fourth combining network input and the third summing node, wherein the output combining network is configured to combine signals received at the combining network inputs into a combined signal that is provided at the combining network output;
a main amplifier path with an output coupled to the first combining network input, wherein the main amplifier path includes a main amplifier stage and a main output matching network coupled to an output of the main amplifier stage, and wherein the main output matching network imparts a phase delay and provides a single impedance inversion to a main RF signal conveyed through the main amplifier path;
first, second, and third peaking amplifier paths, each with an output coupled to a different one of the second, third, and fourth combining network inputs, wherein each of the peaking amplifier paths includes a peaking amplifier stage and a peaking output matching network coupled to an output of the peaking amplifier stage, and wherein each of a first and second peaking output matching network of the first and second peaking amplifier paths imparts a phase delay and provides a single impedance inversion to a peaking RF signal conveyed through the first and second peaking amplifier paths to which each of the first and second peaking output matching network is coupled.

9. The Doherty amplifier of claim 8, wherein the phase delay imparted by each of the main output matching network and the first and second peaking output matching networks is 90 degrees.

10. The Doherty amplifier of claim 8, further comprising:
an power divider that includes a power divider input and first, second, third, and fourth power divider outputs, wherein the first power divider output is coupled to the main amplifier path, the second power divider output is coupled to the first peaking amplifier path, the third power divider output is coupled to the second peaking amplifier path, and the fourth power divider output is coupled to the third peaking amplifier path, and the power divider is configured to divide an input power of an input RF signal received at the power divider input into the main RF signal and first, second, and third peaking RF signals, and to provide the main RF signal to the first power divider output, the first peaking RF signal to the second power divider output, the second peaking RF signal to the third power divider output, and the third peaking RF signal to the fourth power divider output.

11. The Doherty amplifier of claim 10, wherein the power divider further includes first, second, and third delay line elements, wherein the first delay line element is coupled to the first power divider output and imparts a first delay to the main RF signal, the second delay line element is coupled to the second power divider output and imparts a second delay to the first peaking RF signal, and the third delay line element is coupled to the third power divider output and imparts a third delay to the second peaking RF signal, wherein the second delay is less than the first delay, and the third delay is less than the second delay.

12. The Doherty amplifier of claim 11, wherein the second delay is 90 degrees less than the first delay, and the third delay is 90 degrees less than the second delay.

13. The Doherty amplifier of claim 11, wherein the power divider further includes a fourth delay line element that imparts a fourth delay to the third peaking RF signal, wherein the fourth delay is 90 degrees less than the third delay.

14. A Doherty amplifier comprising:
a main amplifier path with an input and an output;
N−1 peaking amplifier paths, wherein each peaking amplifier path has an input and an output, and wherein N is greater than two; and
an output combining network with
a combining network output,
N combining network inputs, with a first combining network input coupled to the output of the main amplifier path, a lowest-order combining network input coupled to a lowest-order peaking amplifier path of the N−1 peaking amplifier paths, and N-2 additional combining network inputs coupled to other paths of the N−1 peaking amplifier paths,
multiple summing nodes, including a final summing node coupled to the combining network output and directly coupled to the first combining network input, and N-2 intermediate summing nodes each directly coupled to a different one of the N-2 additional combining network inputs, and
an offset line coupled between the lowest-order combining network input and a lowest-order summing node of the N-2 intermediate summing nodes, and wherein a longest phase delay imparted by the output combining network on a peaking RF signal between the lowest-order combining network input and the final summing node is greater than all other phase delays imparted by the output combining network on any other RF signal provided to the first combining network input and the N-2 additional combining network inputs.

15. The Doherty amplifier of claim 14, wherein the output combining network further includes N-2 impedance transformers each coupled between different sets of adjacent summing nodes of the multiple summing nodes.

16. The Doherty amplifier of claim 14, wherein:
the main amplifier path includes a main amplifier stage and a first output matching network coupled to an output of the main amplifier stage, wherein the first output matching network imparts a phase delay of 90 degrees and provides a single impedance inversion to a first RF signal conveyed through the main amplifier path; and
each of the N-1 peaking amplifier paths includes a peaking amplifier stage and an output matching network coupled to an output of the peaking amplifier stage, wherein the output matching network of each of N-2 of the peaking amplifier paths imparts a phase delay of 90 degrees and provides a single impedance inversion to an RF signal conveyed through each of the N-2 peaking amplifier paths.

17. The Doherty amplifier of claim 14, wherein:
N equals 3;
the longest phase delay is at least 90 degrees plus an additional phase delay imparted by the offset line; and
all other phase delays imparted by the output combining network on any other RF signal are less than the longest phase delay by at least the phase delay imparted by the offset line.

18. The Doherty amplifier of claim 14, wherein:
N is equal to or greater than 4;
the longest phase delay is at least 180 degrees plus an additional phase delay imparted by the offset line; and
all other phase delays imparted by the output combining network on any other RF signal are less than the longest phase delay by at least the phase delay imparted by the offset line.

19. The Doherty amplifier of claim 14, further comprising:
an N-way power divider that includes a power divider input and N power divider outputs, wherein each of the N power divider outputs is coupled to one path of the main amplifier path and the N-1 peaking amplifier paths, and the N-way power divider is configured to divide an input power of an input RF signal received at the power divider input into N portions of the input RF signal, and to provide the N portions of the input RF signal to the N power divider outputs.

20. The Doherty amplifier of claim 19, wherein the N-way power divider further includes a plurality of delay line elements, which impart various phase delays to the N portions of the input RF signal, wherein, starting with a lowest-order delay line element that is coupled to an input to the lowest-order peaking amplifier path, successively higher-order delay line elements each impart an additional 90 degree phase delay to the portions of the input RF signal received by each of the delay line elements.

21. The Doherty amplifier of claim 14, wherein the output combining network further includes an additional impedance transformer coupled between the final summing node and the combining network output.

* * * * *